United States Patent
Vellanki et al.

(10) Patent No.: US 10,637,423 B2
(45) Date of Patent: Apr. 28, 2020

(54) TRACKING AND CORRECTING GAIN OF OPEN-LOOP DRIVER IN A MULTI-PATH PROCESSING SYSTEM

(71) Applicant: Cirrus Logic International Semiconductor Ltd., Edinburgh (GB)

(72) Inventors: Amar Vellanki, Cedar Park, TX (US); Tejasvi Das, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 51 days.

(21) Appl. No.: 16/140,663

(22) Filed: Sep. 25, 2018

(65) Prior Publication Data

US 2019/0253031 A1    Aug. 15, 2019

Related U.S. Application Data

(60) Provisional application No. 62/630,533, filed on Feb. 14, 2018.

(51) Int. Cl.
*H03G 3/30* (2006.01)
*H03F 3/21* (2006.01)
*H03F 3/217* (2006.01)

(52) U.S. Cl.
CPC ........... *H03G 3/3031* (2013.01); *H03F 3/217* (2013.01); *H03F 3/2171* (2013.01); *H03F 3/2175* (2013.01); *H03F 3/2178* (2013.01)

(58) Field of Classification Search
CPC .............................. H03G 3/3031; H03F 3/217
USPC ........................................................... 330/10
See application file for complete search history.

(56) References Cited

U.S. PATENT DOCUMENTS

| | | | | |
|---|---|---|---|---|
| 9,401,724 B1* | 7/2016 | Gao | ......................... | H03B 1/00 |
| 2012/0026039 A1* | 2/2012 | Ganeshan | ............... | G01S 19/33 |
| | | | | 342/357.73 |
| 2012/0106953 A1* | 5/2012 | Nguyen | ................ | H01S 5/0683 |
| | | | | 398/38 |
| 2014/0266458 A1* | 9/2014 | Scott | ..................... | H03F 1/3241 |
| | | | | 330/291 |
| 2016/0380788 A1* | 12/2016 | Waheed | ................... | H04B 1/30 |
| | | | | 375/319 |
| 2019/0334743 A1* | 10/2019 | Jiang | ................ | H04L 25/03006 |

* cited by examiner

*Primary Examiner* — Patricia T Nguyen
(74) *Attorney, Agent, or Firm* — Jackson Walker L.L.P.

(57) ABSTRACT

A multi-path subsystem may include a first processing path, a second processing path, a mixed signal return path, and a calibration engine configured to: estimate and cancel a direct current (DC) offset of the mixed signal return path, estimate and cancel a DC offset between the first processing path and the second processing path, estimate and cancel a phase difference between the first processing path and a sum of the second processing path and the mixed signal return path, estimate and cancel a return path gain of the mixed signal return path, and track and correct for a gain difference between the first processing path and the second processing path.

26 Claims, 6 Drawing Sheets

TRACKING AND CORRECTING GAIN OF OPEN-LOOP DRIVER IN A MULTI-PATH PROCESSING SYSTEM

RELATED APPLICATION

The present disclosure claims priority to U.S. Provisional Patent Application Ser. No. 62/630,533, filed Feb. 14, 2018, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation (PWM), pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a closed-loop PWM amplifier is chosen in order to provide accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on the speaker load.

However, an option to alternatively drive loads using a single PWM amplifier circuit in either open-loop or closed-loop depending on dynamic characteristics of the signal to be processed may be desirable. When using such a single PWM amplifier circuit, perceptible audio artifacts may occur when switching between open-loop operation and closed-loop operation, and thus, it may be desirable to reduce or eliminate such audio artifacts.

SUMMARY

In accordance with the teachings of the present disclosure, one or more disadvantages and problems associated with existing approaches to processing signals with an amplifier may be reduced or eliminated.

In accordance with embodiments of the present disclosure, a multi-path subsystem may include a first processing path, a second processing path, a mixed signal return path, and a calibration engine configured to: estimate and cancel a first direct current (DC) offset of the mixed signal return path, estimate and cancel a second DC offset between the first processing path and the second processing path, estimate and cancel a phase difference between the first processing path on one hand and the sum of the second processing path and the mixed signal return path on the other hand, estimate and cancel a return path gain of the mixed signal return path, and track and correct for a gain difference between the first processing path and the second processing path.

In accordance with these and other embodiments of the present disclosure, a method for calibrating gain in a multi-path subsystem having a first processing path, a second processing path, and a mixed signal return path may be provided. The method may include estimating and cancelling a first direct current (DC) offset of the mixed signal return path, estimating and cancelling a second DC offset between the first processing path and the second processing path, estimating and cancelling a phase difference between the first processing path and the sum of the second processing path and the mixed signal return path, estimating and cancelling a return path gain of the mixed signal return path, and tracking and correcting for a gain difference between the first processing path and the second processing path.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
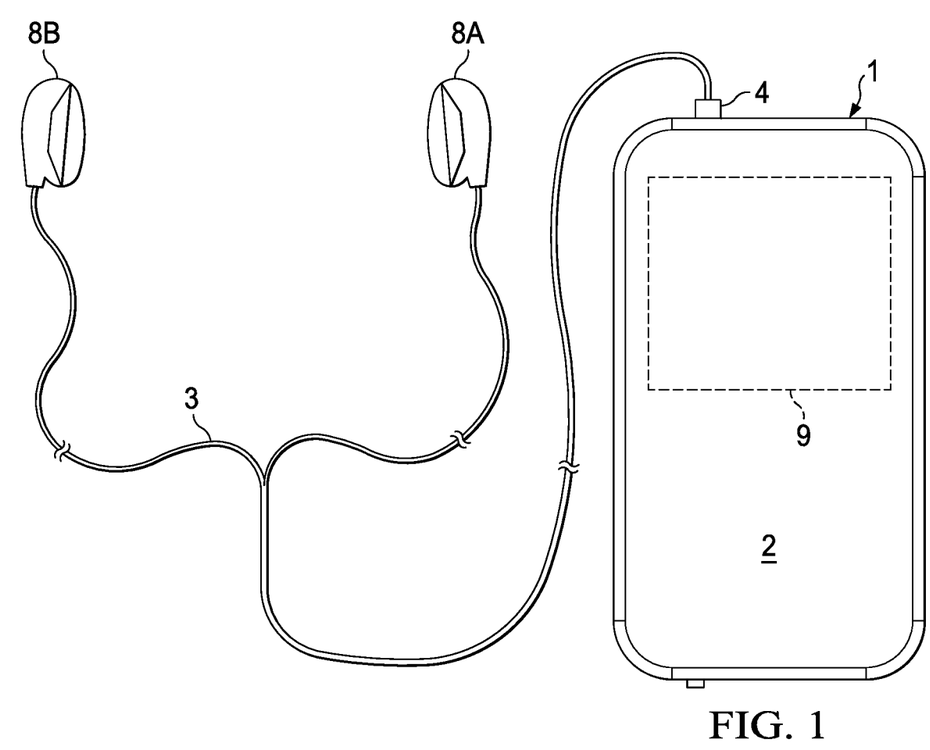
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
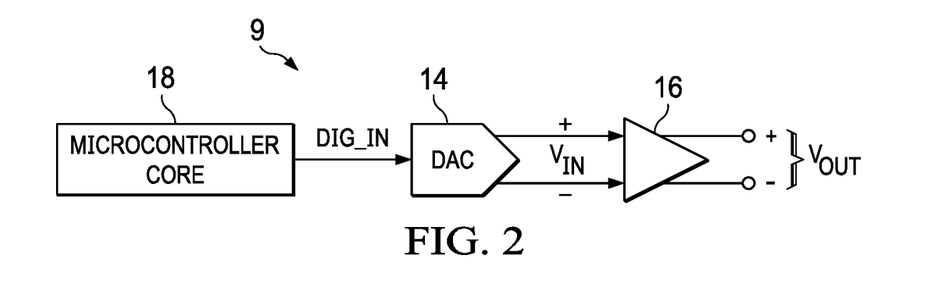
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
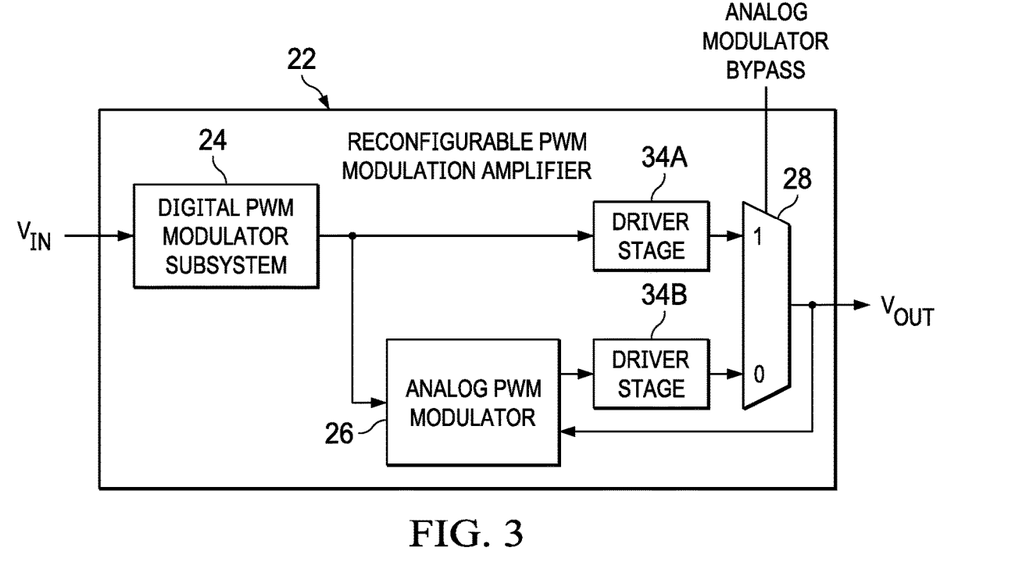
FIG. 3 is a block diagram of selected components of an example reconfigurable PWM modulator, in accordance with embodiments of the present disclosure.

FIG. 3 is a block diagram of selected components of an example reconfigurable pulse width modulation amplifier 22, in accordance with embodiments of the present disclosure. In some embodiments, example reconfigurable pulse width modulation amplifier 22 may be used to implement amplifier 16 of FIG. 2. As shown in FIG. 3, example reconfigurable pulse width modulation amplifier 22 may include a digital PWM modulator subsystem 24 and an analog PWM modulator 26, along with a direct bypass function implemented with a multiplexer 28.

Reconfigurable PWM modulation amplifier 22 may be configured to operate in an analog closed-loop mode through the use of analog PWM modulator 26 when the ANALOG MODULATOR BYPASS control signal received by multiplexer 28 is deasserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26.

Reconfigurable PWM modulation amplifier 22 may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24.

Changing reconfigurable PWM modulation amplifier 22 from the analog closed-loop mode and the digital open-loop mode (and vice versa) may be achieved by, through use of multiplexer 28, selecting which of driver stage 34A and driver stage 34B is to drive output signal $V_{OUT}$.

In some embodiments, a control circuit (not shown) may be used to control multiplexer 28 in order to select a signal processing path for reconfigurable PWM modulation amplifier 22. For example, selection of such multiplexer control signal may be based on one or more characteristics of input signal $V_{IN}$ to the amplifier (e.g., signal magnitude, signal peak, signal envelope, signal frequency, or other characteristic of input signal $V_{IN}$). Thus, reconfigurable PWM modulation amplifier 22 may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal (e.g., signal magnitude, signal peak, signal envelope, signal frequency, or other characteristic of input signal $V_{IN}$). In embodiments in which input signal $V_{IN}$ is an audio signal, selection of the path for processing may be based not only on characteristics of the audio signal within an audible band of frequencies, but also the characteristics of out-of-band components of the signal that propagate to output signal $V_{OUT}$.

Advantageously, the foregoing provides systems and methods for implementing and using a system comprising a reconfigurable amplifier capable of switching between an analog closed-loop modulation amplifier and a digital open-loop modulation amplifier with minimal additional digital logic as compared to that of existing amplifier systems. However, the foregoing system may be susceptible to perceptible audio artifacts, such as "pops" and "clicks," unless steps are taken to reduce or avoid such artifacts. Accordingly, as described in greater detail below with respect to FIG. 4, reconfigurable PWM modulation amplifier 22 may include a calibration subsystem configured to calibrate at least one of a first gain of a first path (open-loop path of digital PWM modulator subsystem 24 and driver stage 34A) and a second gain of a second path (closed-loop path of analog PWM modulator 26) in order that the first gain and the second gain are approximately equal at the time of switching selection between the first path and the second path or vice versa, in order to minimize perceptible audio artifacts due to the switching.

Closed-loop systems, by nature of their feedback loop, may regulate and control their gain irrespective of changes and drifts in either the driver or the actual loading conditions. For example, if a load transducer's impedance characteristics (and/or a driver switch impedance) changes over time due to changes in temperature or aging effects, the closed-loop system's gain may remain unchanged. Open-loop drivers, on the other hand, have no such immunity to drifts in loading conditions. Due to the absence of any feedback or control loop, the gain of an open-loop system is highly dependent on both the load transducer characteristics and the driver switch impedance. Changes in temperature and/or characteristics (e.g., impedance) of the transducer may cause immediate changes to the open-loop gain and may in turn create a mismatch in the gains between open-loop and closed-loop systems. Due to this behavior, it may be desirable to continually monitor open-loop gains for changes and to calibrate or correct for such gain changes caused by process, temperature, and/or loading variations.

Figure 4:
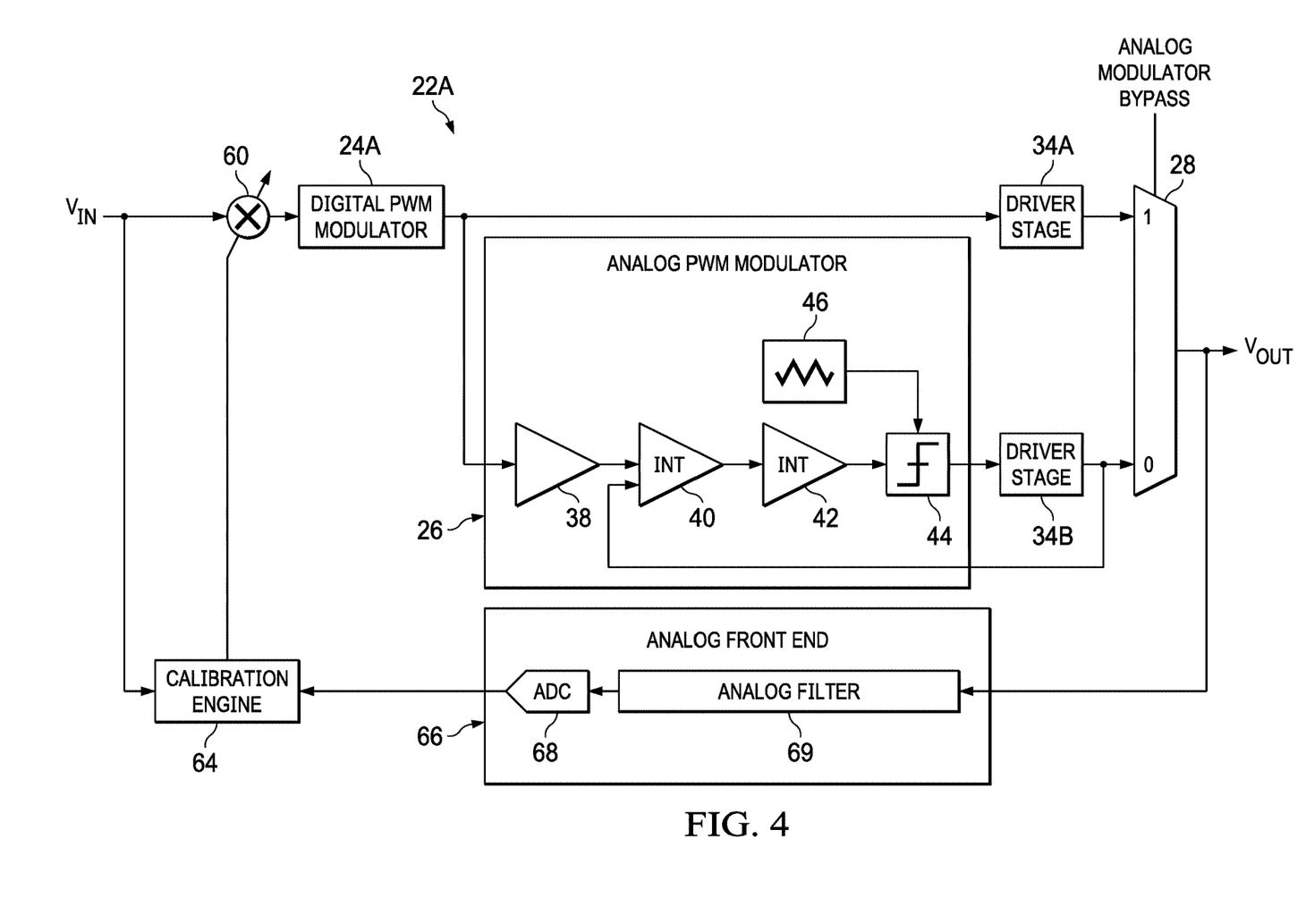
FIG. 4 is a block diagram of selected components of another example reconfigurable PWM modulator, in accordance with embodiments of the present disclosure.

FIG. 4 is a block diagram of selected components of an example reconfigurable PWM modulation amplifier 22A, in accordance with embodiments of the present disclosure. In some embodiments, reconfigurable PWM modulation amplifier 22A may be used to implement reconfigurable PWM modulation amplifier 22 of FIG. 3. As shown in FIG. 4, a single digital PWM modulator 24A may be used to implement digital PWM modulator subsystem 24, and analog PWM modulator 26 may include a buffer 38 configured to buffer a digital PWM signal generated by digital PWM modulator 24A to the input of a first-stage integrator 40 followed by one or more additional stage integrators 42, which are in turn followed by a quantizer 44 using a triangle wave generated by triangle wave generator 46 wherein quantizer 44 may generate an analog PWM signal to driver stage 34B. Although FIG. 4 depicts driver stage 34B as being external to analog PWM modulator 26, in some embodiments, driver stage 34B may be integral to analog PWM modulator 26. As shown in FIG. 4, integrator 40 may integrate a difference between the digital PWM signal generated by digital PWM modulator 24A and a feedback signal output by driver stage 34B.

Also as shown in FIG. 4, a gain element 60 may interface between the input to reconfigurable PWM modulation amplifier 22A and digital PWM modulator 24A. Gain element 60 may apply a variable gain to the input signal before modulation by reconfigurable PWM modulation amplifier 22A. A calibration engine 64 may detect output signal $V_{OUT}$ as processed by an analog front end 66 that may include an analog filter 69 (which may be an active filter or a passive filter) configured to amplify and filter filtered output signal $V_{OUT}$ and an analog-to-digital converter ADC 68 configured to convert the filtered signal from the analog domain to the digital domain. Calibration engine 64 may also sense the input signal to allow it to compare the input signal to the digital domain representation of output signal $V_{OUT}$ in order to determine a gain of the open-loop path, as is described in greater detail below in this disclosure. Although not shown, digital filtering may be performed on each of input signal $V_{IN}$ and output signal $V_{OUT}$ prior to receipt by calibration engine 64 in order to perform calibration based on in-band signal content (e.g., for audio signals, performing calibration only on signals within audible frequency bands, and the input signal and output signal $V_{OUT}$ may also be delay-matched to properly measure gain. Based on the determined gain, calibration engine 64 may calibrate gain element 60 in the digital domain prior to digital modulation such that the open-loop path and closed-loop path have the same path gain.

Figure 5:
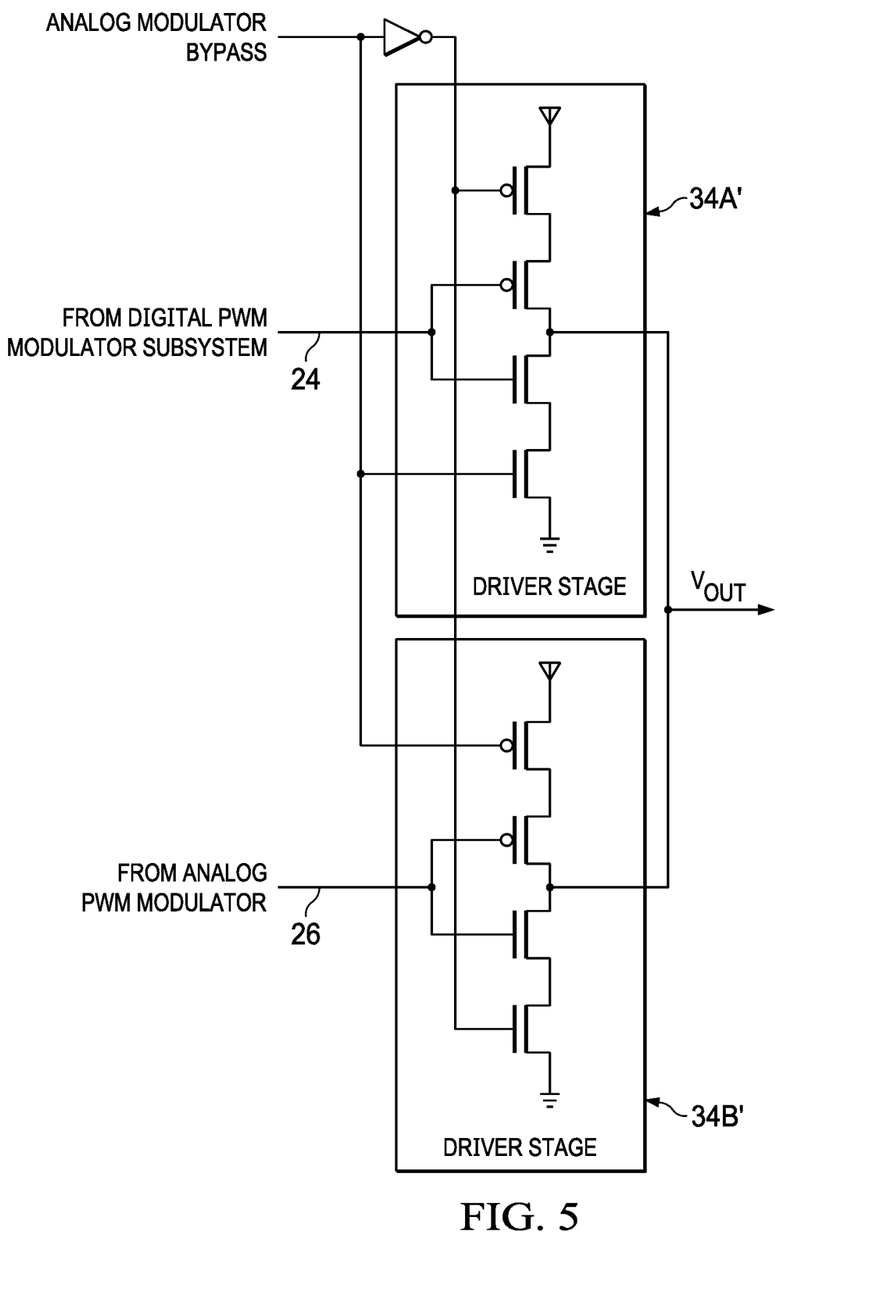
FIG. 5 is a block diagram depicting tri-stated driver stages which may be used in lieu of an output multiplexer in a reconfigurable PWM modulator, in accordance with embodiments of the present disclosure.

Although FIGS. 3 and 4 depict multiplexer 28 configured to select between passing the output of driver stage 34A and passing the output of driver stage 34B as output signal $V_{OUT}$, those of skill in the art will recognize that any other suitable circuit, system, device, or apparatus may be used in addition to or in lieu of multiplexer 28 in order to select between passing the output of driver stage 34A and passing the output of driver stage 34B as output signal $V_{OUT}$. As a non-limiting example, FIG. 5 is a block diagram depicting examples of tri-stated driver stages 34A' and 34B' in lieu of driver stages 34A and 34B, respectively.

Tri-stated driver stages 34A' and 34B', by nature of being tri-stated and having their respective outputs as wired-OR outputs, may perform the logical function of multiplexer 28 while dispensing with the need for multiplexer 28. As shown in FIG. 5 reconfigurable PWM modulation amplifier 22 may be configured to operate in the analog closed-loop mode through the use of analog PWM modulator 26 when the ANALOG MODULATOR BYPASS control signal is deasserted, thus disabling driver stage 34A' and enabling 34B' to drive output signal $V_{OUT}$. Likewise, reconfigurable PWM modulation amplifier 22 may be configured to operate in the digital open-loop mode through the use of digital PWM modulator subsystem 24 when the ANALOG MODULATOR BYPASS control signal is asserted, thus disabling driver stage 34B' and enabling 34A' to drive output signal $V_{OUT}$.

The gain calibration performed in accordance herein may ensure that a first gain of the open-loop path and a second gain of the closed-loop path are approximately equal (e.g., having a gain difference below audible thresholds in an audio system) at the time of switching selection between the open-loop path and the closed-loop path or vice versa, in order to minimize artifacts due to the switching.

Calibration engine 64 may be configured to perform calibration at any suitable time. In some embodiments, calibration engine 64 may perform calibration at production/product test engineering of reconfigurable PWM modulation amplifier 22, at system production of a larger system utilizing reconfigurable PWM modulation amplifier 22, and/or continuously or periodically during end use of the system utilizing reconfigurable PWM modulation amplifier 22. Calibration at production/product test engineering of reconfigurable PWM modulation amplifier 22 may calibrate for some process variation thus reducing intrinsic, systematic, or chip-based variations for reconfigurable PWM modulation amplifier 22. Calibration within system production of a larger system utilizing reconfigurable PWM modulation amplifier 22 may allow for more robust calibration of process variation that includes other circuits that interface with reconfigurable PWM modulation amplifier 22, including the actual loads/transducers to be driven by reconfigurable PWM modulation amplifier 22. Calibration during end use of a system utilizing reconfigurable PWM modulation amplifier 22 may calibrate for temperature, voltage, and/or other real-time variances in operating parameters associated with reconfigurable PWM modulation amplifier 22, and such calibration can be rendered accurate due to calibration being performed with the actual load driven by reconfigurable PWM modulation amplifier 22.

Figure 6:
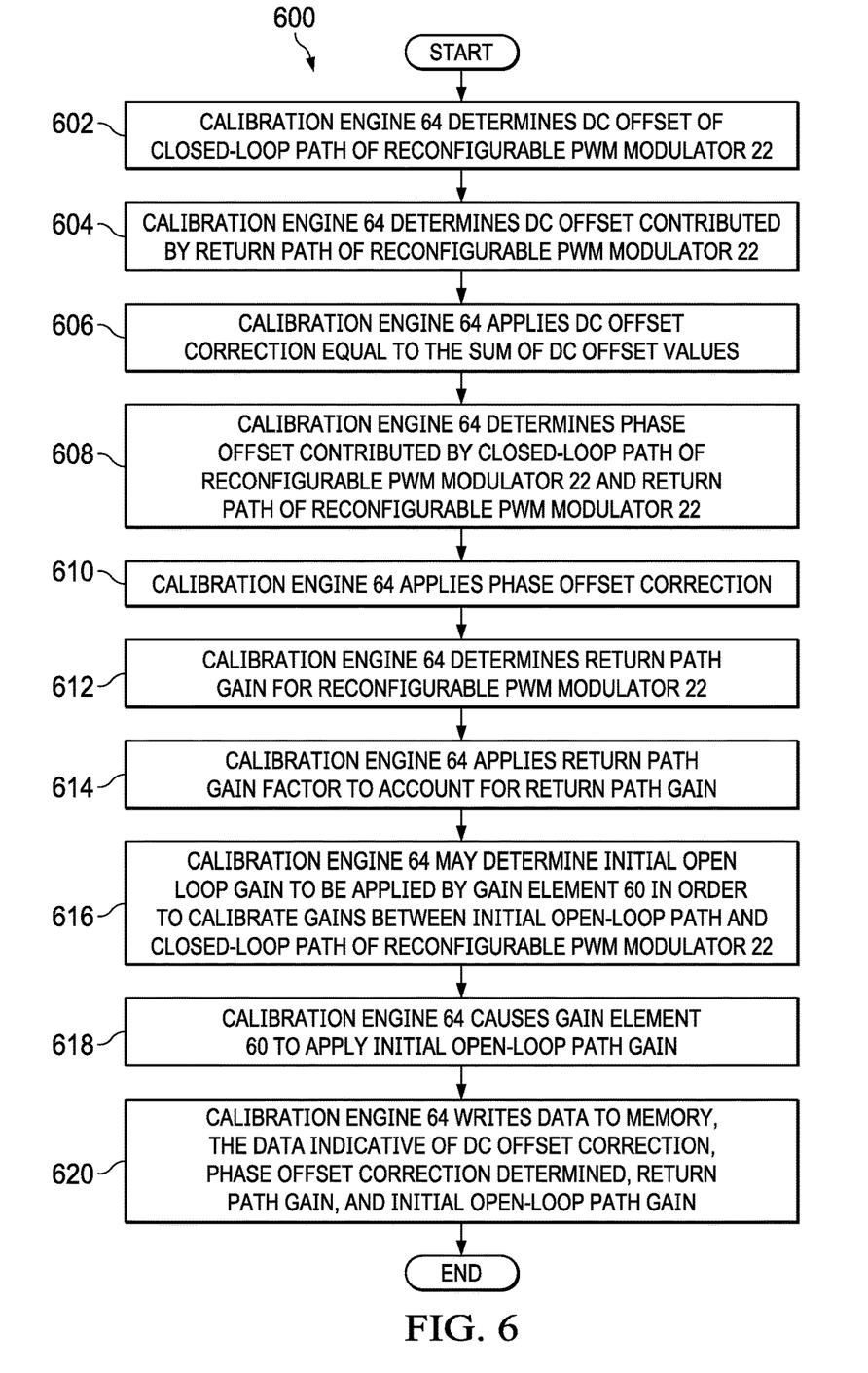
FIG. 6 illustrates a flow chart of an example method for performing gain calibration during production/product test engineering of a reconfigurable PWM modulator, in accordance with embodiments of the present disclosure.

FIG. 6 illustrates a flow chart of an example method 600 for performing gain calibration during production/product test engineering of a reconfigurable PWM modulator 22, in accordance with embodiments of the present disclosure. According to some embodiments, method 600 may begin at step 602. As noted above, teachings of the present disclosure may be implemented in a variety of configurations of reconfigurable PWM modulator 22. As such, the preferred initialization point for method 600 and the order of the steps comprising method 600 may depend on the implementation chosen.

At step 602, calibration engine 64 may determine a direct current (DC) offset of the closed-loop path of reconfigurable PWM modulator 22 relative to the open-loop path of reconfigurable PWM modulator 22. With reference to FIG. 4, such DC offset may be contributed by the signal path of the closed-loop path of reconfigurable PWM modulator 22 from the output of digital PWM modulator 24A to the output of driver stage 34B. Such determination of DC offset of the closed-loop path of reconfigurable PWM modulator 22 may include, without measuring a DC offset at the output of driver stage 34A or driver stage 34B (e.g., when in closed-loop mode) and applying an opposite DC correction value in either the digital domain or in the analog domain of reconfigurable PWM modulator 22. One example of an analog DC correction method may include an current-mode digital-to-analog converter (DAC) coupled to an input transistors integrator 40 of analog PWM modulator 26, such that the current-mode DAC may intentionally vary the offset of the analog PWM modulator 26 within the range and resolution of the current-mode DAC.

At step 604, calibration engine 64 may determine a DC offset contributed by the return path of reconfigurable PWM modulator 22 between the output of reconfigurable PWM modulator 22 (e.g., the electrical node of output signal $V_{OUT}$) and the input of calibration engine 64 from analog front end 66. Such determination of DC offset of the return path of reconfigurable PWM modulator 22 may include providing the return path with a zero signal (e.g., only a DC common-mode voltage applied), which may cause an implicit DC offset of the return path to be digitized by the return-path ADC, and then apply low-pass filtering to extract the DC offset of the return path from the output of ADC 68. Once this return path DC offset value is known, it may be subtracted in the various calculations made by calibration engine 64.

At step 606, calibration engine 64 may apply a DC offset correction equal to the sum of the DC offset values determined in each of steps 602 and 604. In some embodiments, calibration engine 64 may apply such DC offset correction within internal circuitry of calibration engine 64 (e.g., calibration engine 64 may account for such DC offset by applying an appropriate corrective factor to either or both of input voltage $V_{IN}$ and the input of calibration engine 64 received from analog front end 66). In some embodiments, calibration engine 64 may repeat the DC offset determination of steps 602 and 604 with DC offset correction applied in order to verify the DC offset calibration performed in steps 602-606.

At step 608, calibration engine 64 may determine a phase offset contributed by the closed-loop path of reconfigurable PWM modulator 22A and return path of reconfigurable PWM modulator 22. With reference to FIG. 4, such phase offset may be contributed by the signal path of the closed-loop path and return path of reconfigurable PWM modulator 22 from the output of digital PWM modulator 24A to the input of calibration engine 64 from analog front end 66. Such determination of phase offset of the closed-loop path and return path of reconfigurable PWM modulator 22 may include applying a calibration pilot signal directly to calibration engine 64, applying the same calibration pilot signal such that it travels through the closed-loop path and the return path of reconfigurable PWM modulator 22A until it finally reaches calibration engine 64, and comparing, by calibration engine 64, the two resulting signals, the phase difference of which may be used to directly determine the phase offset correction that needs to be applied.

At step 610, calibration engine 64 may apply a phase offset correction to account for the phase offset determined in step 608. In some embodiments, calibration engine 64 may apply such phase offset correction within internal circuitry of calibration engine 64 (e.g., calibration engine 64 may account for such phase offset by applying an appropriate signal delay to either or both of input voltage $V_{IN}$ and the input of calibration engine 64 received from analog front end 66). In some embodiments, calibration engine 64 may repeat the phase offset determination of step 608 with the phase offset correction applied in order to verify the phase offset calibration performed in steps 608-610.

At step 612, calibration engine 64 may determine a return path gain of the return path of reconfigurable PWM modulator 22, while using the closed-loop path of reconfigurable PWM modulator 22 as the selected signal path. With reference to FIG. 4, such return path gain may be equal to the output of reconfigurable PWM modulator 22 (e.g., the electrical node of output signal $V_{OUT}$) and the input of calibration engine 64 from analog front end 66. Such determination of the return path gain of reconfigurable PWM modulator 22 may include applying a calibration pilot signal directly to calibration engine 64, applying the same calibration pilot signal such that it travels through the closed-loop path and the return path of reconfigurable PWM modulator 22A until it finally reaches calibration engine 64, and comparing, by calibration engine 64, the two resulting signals, the gain difference of which may be used to directly determine the gain of the return path.

At step 614, calibration engine 64 may apply a return path gain factor to account for the return path gain determined in step 612. In some embodiments, calibration engine 64 may apply such return path gain factor within internal circuitry of calibration engine 64 (e.g., calibration engine 64 may account for such return path gain by applying an appropriate signal gain factor to either or both of input voltage $V_{IN}$ and the input of calibration engine 64 received from analog front end 66). In some embodiments, calibration engine 64 may repeat the return path gain determination of step 612 with the return path gain factor applied in order to verify the return path calibration performed in steps 612-614.

At step 616, calibration engine 64 may, with the DC offset, phase offset, and return path gain appropriately calibrated as described above, determine an initial open loop gain to be applied by gain element 60 in order to calibrate the gains between the open-loop path and the closed-loop path of reconfigurable PWM modulator 22. With all of the above-mentioned calibrations performed in steps 602-614, the open-loop gain may be the only variable left to be determined. Such determination of the initial open-loop path gain of reconfigurable PWM modulator 22 may include applying a pilot signal or applying an existing audio signal that is being input to the system directly to calibration engine 64, applying the same signal such that it propagates through the open-loop path and through the return path, receiving the output of the return path caused by the signal, and comparing the pilot signal and the pilot signal as processed by the open-loop path and the return path (e.g., by comparing signal magnitudes, signal averages, or signal root-mean-squares), with the differences of the two signals being indicative of the open-loop gain, such that calibration engine may apply an appropriate gain correction factor at gain element 60, as described below.

At step 618, calibration engine 64 may cause gain element 60 to apply the initial open-loop path gain as determined in step 616. In some embodiments, calibration engine 64 may repeat the initial open-loop path gain determination of step 616 with the initial open-loop path gain applied in order to verify the return path calibration performed in steps 616-618.

At step 620, calibration engine 64 may write data to a memory (not explicitly shown) accessible to calibration engine 64, the data indicative of the DC offset correction determined at steps 602 and 604, the phase offset correction determined at step 608, the return path gain determined at step 612, and the initial open-loop path gain determined at step 616. In some embodiments, the data indicative of the initial open-loop path gain may be a ratio between the gain of the closed-loop path (e.g., the gain between the input of analog PWM modulator 26 and the output of driver stage 34B) and the initial open-loop path gain.

Although FIG. 6 discloses a particular number of steps to be taken with respect to method 600, method 600 may be executed with greater or fewer steps than those depicted in FIG. 6. In addition, although FIG. 6 discloses a certain order of steps to be taken with respect to method 600, the steps comprising method 600 may be completed in any suitable order.

Method 600 may be implemented using calibration engine 64 or any other system operable to implement method 600. In certain embodiments, method 600 may be implemented partially or fully in software and/or firmware embodied in computer-readable media.

Figure 7:
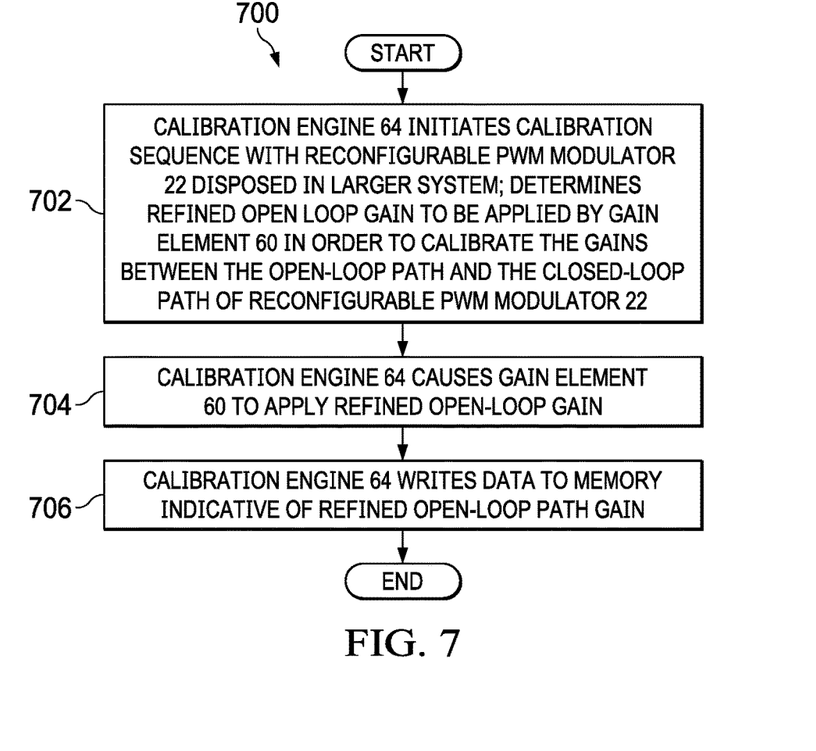
FIG. 7 illustrates a flow chart of an example method for performing gain calibration during system production of a larger system comprising a reconfigurable PWM modulator, in accordance with embodiments of the present disclosure.

FIG. 7 illustrates a flow chart of an example method 700 for performing gain calibration during system production of a larger system comprising a reconfigurable PWM modulator 22, in accordance with embodiments of the present disclosure. According to some embodiments, method 700 may begin at step 702. As noted above, teachings of the present disclosure may be implemented in a variety of configurations of reconfigurable PWM modulator 22. As such, the preferred initialization point for method 700 and the order of the steps comprising method 700 may depend on the implementation chosen.

At step 702, calibration engine 64 may initiate a calibration sequence with reconfigurable PWM modulator 22 disposed in a larger system, which may include a model load approximating a load or an actual load transducer that may be coupled to the output of reconfigurable PWM modulator 22 during end-use of reconfigurable PWM modulator 22. Because the values of DC offset, phase offset, and return path gain may vary only with process, but not voltage and temperature, calibration engine 64 may load the data stored in method 600 relating to DC offset, phase offset, and return path gain in determining a refined open-loop gain with reconfigurable PWM modulator 22 interfaced with the larger system and the load.

At step 704, calibration engine 64 may cause gain element 60 to apply the refined open-loop gain as determined in step 702. In some embodiments, calibration engine 64 may repeat the refined open-loop path gain determination of step 702 with the refined open-loop path gain factor applied in order to verify the return path calibration performed in steps 702-704.

At step 706, calibration engine 64 may write data to a memory (not explicitly shown) accessible to calibration engine 64, such data indicative of refined open-loop path gain. In some embodiments, the data indicative of the refined open-loop path gain may be a ratio between the initial open-loop path gain (e.g., the gain between the input of analog PWM modulator 26 and the output of driver stage 34B) and the refined open-loop path gain. Accordingly, during end-use operation, the values indicative of the initial open-loop path gain and/or the refined open-loop path gain may be used in setting an open-loop path gain to be applied at startup of reconfigurable PWM modulator 22 during its end use (e.g., use in an audio system or other signal processing system). For example, in some embodiments, the open-loop path gain applied at start-up of reconfigurable PWM modulator 22 during its end use may be a product of the ratio between the initial open-loop path gain and the refined open-loop path gain and the ratio between the gain of the closed-loop path gain and the initial open-loop path gain (e.g., the result being a ratio between the gain of the closed-loop path gain and the refined open-loop path gain).

Although FIG. 7 discloses a particular number of steps to be taken with respect to method 700, method 700 may be executed with greater or fewer steps than those depicted in FIG. 7. In addition, although FIG. 7 discloses a certain order of steps to be taken with respect to method 700, the steps comprising method 700 may be completed in any suitable order.

Method 700 may be implemented using calibration engine 64 or any other system operable to implement method 700. In certain embodiments, method 700 may be implemented partially or fully in software and/or firmware embodied in computer-readable media.

Figure 8:
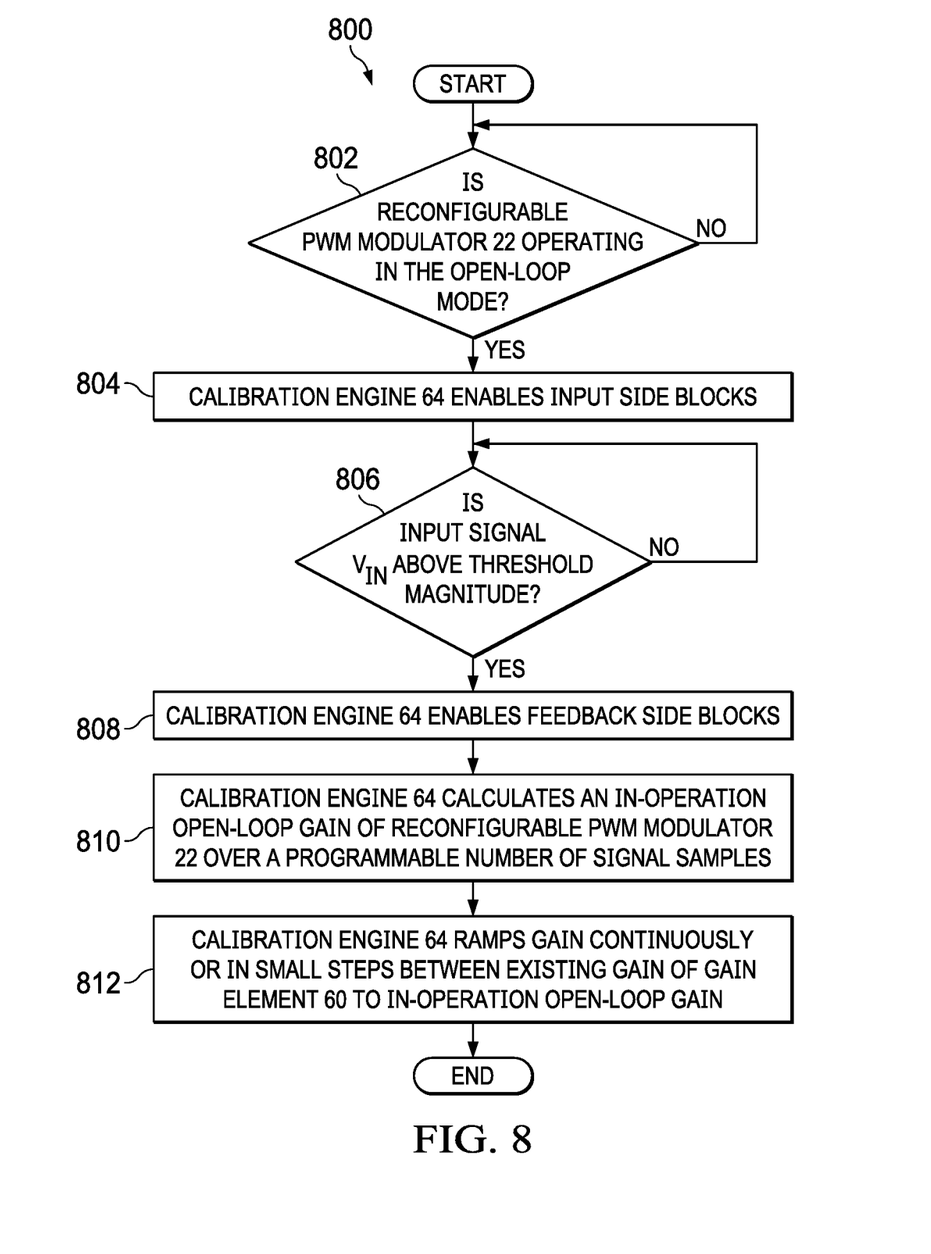
FIG. 8 illustrates a flow chart of an example method for performing gain calibration during end use of a larger system comprising a reconfigurable PWM modulator, in accordance with embodiments of the present disclosure.

FIG. 8 illustrates a flow chart of an example method 800 for performing continuous or periodic gain calibration during end use of a larger system comprising a reconfigurable PWM modulator 22, in accordance with embodiments of the present disclosure. According to some embodiments, method 800 may begin at step 802. As noted above, teachings of the present disclosure may be implemented in a variety of configurations of reconfigurable PWM modulator 22. As such, the preferred initialization point for method 800 and the order of the steps comprising method 800 may depend on the implementation chosen.

At step 802, calibration engine 64 may determine whether reconfigurable PWM modulator 22 is operating in the open-loop mode. If reconfigurable PWM modulator 22 is operating in the open-loop mode, method 800 may proceed to step 804. Otherwise, method 800 may remain at step 802 until reconfigurable PWM modulator 22 operates in the open-loop mode.

At step 804, calibration engine 64 may enable its reference or input side blocks (e.g., the components of calibration engine 64 that receive and process input signal $V_{IN}$). After such input side blocks settle, at step 806, calibration engine 64 may determine whether input signal $V_{IN}$ is above a threshold magnitude. Such threshold magnitude may represent a minimum magnitude of input signal $V_{IN}$ necessary to perform gain calibration. For example, if input signal $V_{IN}$ is not above the threshold magnitude, there may not exist sufficient signal-to-noise ratio to calculate a gain correction error with an acceptable level of accuracy. If input signal $V_{IN}$ is above the threshold magnitude, method 800 may proceed to step 808. Otherwise, method 800 may remain at step 806 until input signal $V_{IN}$ is above the threshold magnitude.

At step 808, calibration engine 64 may enable its feedback side blocks (e.g., the components of calibration engine 64 that receive and process the feedback signal provided by analog front end 66). After such feedback side blocks settle and analog front end 66 powers up, at step 810, calibration engine 64 may calculate an in-operation open-loop gain of reconfigurable PWM modulator 22 over a programmable number of signal samples, using the data stored in method 600 relating to DC offset, phase offset, and return path gain in determining the in-operation open-loop gain. In some embodiments, the calculated gain may be a product of the ratio between the initial open-loop path gain and the refined open-loop path gain, the ratio between the gain of the closed-loop path gain and the initial open-loop path gain, and the ratio between refined open-loop path gain and the in-operation open-loop gain (e.g., the result being a ratio between the gain of the closed-loop path gain and the in-operation open-loop gain).

At step 812, to reduce audible audio artifacts associated with modifying the gain of gain element 60, calibration engine 64 may ramp the gain continuously or in small steps between an existing gain of gain element 60 to the in-operation open-loop gain. For example, if calibration engine 64 determines that a gain should be changed by a factor of x, calibration engine 64 may change the gain in a series of y steps, wherein during each step, gain is changed by an amount x/y. In some of such embodiments, calibration engine 64 may further be configured to transition between consecutive steps of the series of steps at one of a zero crossing of the input signal and a zero crossing of a pulse width modulation signal derived from the input signal within the system.

After the gain of gain element 60 is ramped to the in-operation open-loop gain, method 800 may end.

Although FIG. 8 discloses a particular number of steps to be taken with respect to method 800, method 800 may be executed with greater or fewer steps than those depicted in FIG. 8. In addition, although FIG. 8 discloses a certain order of steps to be taken with respect to method 800, the steps comprising method 800 may be completed in any suitable order.

Method 800 may be implemented using calibration engine 64 or any other system operable to implement method 800. In certain embodiments, method 800 may be implemented partially or fully in software and/or firmware embodied in computer-readable media.

In some embodiments, calibration engine 64 may be configured to abort execution of method 800 if one or more conditions for aborting in-operation calibration occur. For example, in some embodiments, calibration engine 64 may abort execution of method 800 if, during execution of method 800, the magnitude of input signal $V_{IN}$ falls below the threshold magnitude described in step 806. In these and other embodiments, calibration engine 64 may abort execution of method 800 if, during execution of method 800, reconfigurable PWM modulator 22 switches between operation in the open-loop mode to operation is the closed-loop mode.

In these and other embodiments, calibration engine 64 may be enabled to perform calibration at intermittent periods. For example, calibration engine 64 may perform calibration for a period of time and cease calibration for another period of time before again calibrating.

In these and other embodiments, the continuous or periodic calibration described herein may be performed using an actual audio playback signal or using a pilot signal outside of the audible audio band.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A multi-path subsystem comprising:
   a first processing path;
   a second processing path;
   a mixed signal return path; and
   a calibration engine configured to:
      estimate and cancel a first direct current (DC) offset of the mixed signal return path;
      estimate and cancel a second DC offset between the first processing path and the second processing path;
      estimate and cancel a phase difference between the first processing path on one hand and the sum of the second processing path and the mixed signal return path on the other hand;
      estimate and cancel a return path gain of the mixed signal return path; and
      track and correct for a gain difference between the first processing path and the second processing path.

2. The multi-path subsystem of claim 1, wherein the calibration engine is configured to perform its functionality during at least one of:
   a product test engineering phase of the multi-path subsystem;
   a system engineering phase of a larger system comprising the multi-path subsystem; and
   end use of the multi-path subsystem and the larger system.

3. The multi-path subsystem of claim 2, wherein in the product test engineering phase, the calibration engine uses a model of a load to be driven by the multi-path subsystem in end use in order to perform its functionality.

4. The multi-path subsystem of claim 2, wherein in the system engineering phase and in end use, the calibration engine uses an actual load driven by the multi-path subsystem in end use in order to perform its functionality.

5. The multi-path subsystem of claim 1, wherein the calibration engine is configured to correct for the gain difference by applying a gain correction equal to a ratio of a first gain of the first processing path and a second gain of the second processing path.

6. The multi-path subsystem of claim 1, further comprising a digital pulse width modulator subsystem, and wherein;
the first processing path is coupled to an output of the digital pulse width modulator subsystem; and
the second processing path is coupled to the output of the digital pulse width modulator subsystem and configured to drive a closed-loop analog pulse width modulator, wherein one of the first processing path and the second processing path is selected for processing a signal based on one or more characteristics of a signal;
wherein the first gain and the second gain are approximately equal at a time of switching selection between the first processing path and the second processing path or vice versa, in order to minimize artifacts due to the switching.

7. The multi-path subsystem of claim 1, further comprising the calibration subsystem configured to enable tracking and correcting for the gain difference only if a signal is above a threshold magnitude.

8. The multi-path subsystem of claim 7, wherein the calibration subsystem is further configured to abort tracking and correcting for the gain difference if the signal falls below the threshold magnitude during calibration.

9. The multi-path subsystem of claim 8, wherein the calibration subsystem is further configured to enable tracking and correcting for the gain difference only if the first processing path is selected.

10. The multi-path subsystem of claim 9, wherein the calibration subsystem is further configured to abort tracking and correcting for the gain difference if the second processing path is selected at any time during calibration.

11. The multi-path subsystem of claim 1, wherein:
the first processing path comprises an open-loop driver stage;
the second processing path comprises a closed-loop driver stage; and
the system further comprises circuitry for selecting between the first processing path and the second processing path for processing a signal based on one or more characteristics of the signal.

12. The multi-path subsystem of claim 11, wherein the circuitry comprises a multiplexer.

13. The multi-path subsystem of claim 11, wherein the circuitry comprises control circuitry for tri-stating at least one driver stage comprising the open-loop driver stage and the closed-loop driver stage in order to disable the at least one driver stage.

14. A method for calibrating gain in a multi-path subsystem having a first processing path, a second processing path, and a mixed signal return path, the method comprising:
estimating and cancelling a first direct current (DC) offset of the mixed signal return path;
estimating and cancelling a second DC offset between the first processing path and the second processing path;
estimating and cancelling a phase difference between the first processing path and a sum of the second processing path and the mixed signal return path;
estimating and cancelling a return path gain of the mixed signal return path; and
tracking and correcting for a gain difference between the first processing path and the second processing path.

15. The method of claim 14, wherein the method is configured to perform its functionality during at least one of:
a product test engineering phase of the multi-path subsystem;
a system engineering phase of a larger system comprising the multi-path subsystem; and
end use of the multi-path subsystem and the larger system.

16. The method of claim 15, wherein in the product test engineering phase, the method uses a model of a load to be driven by the multi-path subsystem in end use in order to perform its functionality.

17. The method of claim 15, wherein in the system engineering phase and in end use, the method uses an actual load driven by the multi-path subsystem in end use in order to perform its functionality.

18. The method of claim 14, further comprising correcting for the gain difference by applying a gain correction equal to a ratio of a first gain of the first processing path and a second gain of the second processing path.

19. The method of claim 14, wherein the multi-path system further comprises a digital pulse width modulator subsystem, and wherein;
the first processing path is coupled to an output of the digital pulse width modulator subsystem; and
the second processing path is coupled to the output of the digital pulse width modulator subsystem and configured to drive a closed-loop analog pulse width modulator, wherein one of the first processing path and the second processing path is selected for processing a signal based on one or more characteristics of a signal;
wherein the first gain and the second gain are approximately equal at a time of switching selection between the first processing path and the second processing path or vice versa, in order to minimize artifacts due to the switching.

20. The method of claim 14, further comprising enabling tracking and correcting for the gain difference only if a signal is above a threshold magnitude.

21. The method of claim 20, further comprising aborting tracking and correcting for the gain difference if the signal falls below the threshold magnitude during calibration.

22. The method of claim 21, further comprising enabling tracking and correcting for the gain difference only if the first processing path is selected.

23. The method of claim 22, further comprising aborting tracking and correcting for the gain difference if the second processing path is selected at any time during calibration.

24. The method of claim 14, wherein:
the first processing path comprises an open-loop driver stage;
the second processing path comprises a closed-loop driver stage; and
the system further comprises circuitry for selecting between the first processing path and the second processing path for processing a signal based on one or more characteristics of the signal.

25. The method of claim 24, wherein the circuitry comprises a multiplexer.

26. The method of claim 24, wherein the circuitry comprises control circuitry for tri-stating at least one driver stage comprising the open-loop driver stage and the closed-loop driver stage in order to disable the at least one driver stage.

* * * * *